United States Patent
Schabbach et al.

(10) Patent No.: US 12,533,465 B2
(45) Date of Patent: Jan. 27, 2026

(54) CHEMICAL WAKE-UP MECHANISM FOR ACTIVE ELECTRONICS IN PEN INJECTORS

(71) Applicant: Sanofi, Paris (FR)

(72) Inventors: Michael Schabbach, Frankfurt am Main (DE); Johannes Alpers, Frankfurt am Main (DE); Ganesh Appusamy Vedhachalam, Frankfurt am Main (DE); Jörg Bigalke, Frankfurt am Main (DE); Martin Rausch, Frankfurt am Main (DE); Anna Baccaro, Frankfurt am Main (DE)

(73) Assignee: SANOFI, Paris (FR)

( * ) Notice: Subject to any disclaimer, the term of this patent is extended or adjusted under 35 U.S.C. 154(b) by 1034 days.

(21) Appl. No.: 17/621,557

(22) PCT Filed: Jun. 25, 2020

(86) PCT No.: PCT/EP2020/067856
§ 371 (c)(1),
(2) Date: Dec. 21, 2021

(87) PCT Pub. No.: WO2021/001256
PCT Pub. Date: Jan. 7, 2021

(65) Prior Publication Data
US 2022/0395639 A1    Dec. 15, 2022

(30) Foreign Application Priority Data
Jul. 1, 2019    (EP) .................................. 19305892

(51) Int. Cl.
*A61M 5/20*    (2006.01)
*A61M 5/31*    (2006.01)

(52) U.S. Cl.
CPC ............ *A61M 5/20* (2013.01); *A61M 5/3146* (2013.01); *A61M 2005/2026* (2013.01);
(Continued)

(58) Field of Classification Search
CPC .. A61M 2005/1402; A61M 2005/2006; A61M 2005/2026; A61M 2205/0277;
(Continued)

(56) References Cited

U.S. PATENT DOCUMENTS 5,769,877 A    6/1998    Barreras
8,712,483 B2    4/2014    Haartsen et al.
(Continued)

FOREIGN PATENT DOCUMENTS

EP    2923652    1/2020
JP    2015531311 A    11/2015
(Continued)

OTHER PUBLICATIONS

Embedded.com [online], "Waking up a capacitive touch-sensing device with an MCU peripheral, " Jul. 27, 2011, retrieved on Jan. 26, 2022, retrieved from URL <"https://www.embedded.com/waking-up-a-capacitive-touch-sensing-device-with-an-mcu-peripheral/">, 14 pages.
(Continued)

*Primary Examiner* — Shefali D Patel
(74) *Attorney, Agent, or Firm* — Bond Schoeneck & King, PLLC

(57) ABSTRACT

Implementations of the present disclosure are directed to conserving energy of an injection device that includes an energy source configured to power an electronic component, a priming component configured to generate a trigger, a reactant configured to generate an instantiation signal in response to the trigger, and a sensor configured to detect and process the instantiation signal and generate an activation signal to activate the energy source.

20 Claims, 4 Drawing Sheets

(52) U.S. Cl.
CPC ............... *A61M 2205/0277* (2013.01); *A61M 2205/3368* (2013.01); *A61M 2205/50* (2013.01); *A61M 2205/502* (2013.01); *A61M 2205/82* (2013.01); *A61M 2205/8275* (2013.01)

(58) Field of Classification Search
CPC .. A61M 2205/3327; A61M 2205/3368; A61M 2205/50; A61M 2205/502; A61M 2205/505; A61M 2205/82; A61M 2205/8206; A61M 2205/8212; A61M 2205/8275; A61M 5/20; A61M 5/3146; A61M 5/31548

See application file for complete search history.

(56) References Cited

U.S. PATENT DOCUMENTS

| | | | |
|---|---|---|---|
| 9,108,006 B2 | 8/2015 | Jensen et al. |
| 9,186,465 B2 | 11/2015 | Jorgensen et al. |
| 9,289,559 B2 | 3/2016 | Pedersen et al. |
| 9,459,089 B2 | 10/2016 | Ganton et al. |
| 9,649,448 B2 | 5/2017 | Madsen |
| 2015/0241393 A1 | 8/2015 | Ganti et al. |
| 2015/0292856 A1 | 10/2015 | Ganton et al. |
| 2016/0018900 A1 | 1/2016 | Tu et al. |
| 2016/0066911 A1 | 3/2016 | Baber et al. |
| 2019/0134309 A1 | 5/2019 | Wendland et al. |

FOREIGN PATENT DOCUMENTS

| | | |
|---|---|---|
| JP | 2018-517489 A | 7/2018 |
| JP | 2019-500093 A | 1/2019 |
| WO | WO 2016/193122 A1 | 12/2016 |
| WO | WO 2017/089255 A1 | 6/2017 |
| WO | WO 2017/189153 | 11/2017 |
| WO | WO 2018/202586 | 11/2018 |

OTHER PUBLICATIONS

International Preliminary Report on Patentability in International Application No. PCT/EP2020/067856, dated Jan. 13, 2022, 8 pages.
International Search Report and Written Opinion in International Application No. PCT/EP2020/067856, dated Jul. 23, 2020, 9 pages.
Signalquest.com [online], "SQ-SEN-200: Tilt & Vibration Sensor, Ultra Low Power, Omnidirectional," 1999-2022, retrieved on Jan. 26, 2022, retrieved from URL <"https://signalquest.com/product/components/sq-sen-200/">, 4 pages.

CHEMICAL WAKE-UP MECHANISM FOR ACTIVE ELECTRONICS IN PEN INJECTORS

CROSS REFERENCE TO RELATED APPLICATIONS

The present application is the national stage entry of International Patent Application No. PCT/EP2020/067856, filed on Jun. 25, 2020, and claims priority to Application No. EP 19305892.2, filed on Jul. 1, 2019, the disclosures of which are incorporated herein by reference.

TECHNICAL FIELD

Electronically-enabled injection devices assist users in administering a medicament and can also enable transmission of treatment data to the medical staff. Electronically enabled injection devices include an electronic component configured to provide continuous active sensing and connectivity properties, functions that require an energy supply. The energy supply can be a battery, which supplies power to the electric component. The configuration of electronically enabled injection devices can limit the capacity of the energy supply, which affects the life of the energy supply.

The life of an electronically enabled injection device can be limited by the life of its energy supply. Some electronically enabled injection devices can be kept on shelves for extended periods of time before being used. Current configurations of electronically enabled injection devices lead to idle drainage of the energy supply, such that, even if the electronically enabled injection device has not been used, long shelf life can exhaust the life of the energy supply. A low battery condition can lead to no- or malfunction of the device, or it can lead to a missed dosage, by stopping the operation of the electronic components.

SUMMARY

Implementations of the present disclosure include coupling mechanisms and systems configured for extending the life of electronically enabled injection devices by preventing idle drainage of the energy source. In accordance with one aspect of the present invention, an electronically enabled injection device includes an energy source configured to power an electronic component, a priming component configured to generate a trigger, a reactant configured to generate an instantiation signal in response to the trigger, and a sensor configured to detect and process the instantiation signal and generate an activation signal to activate the energy source.

In some implementations, the reactant is included in a bearing and the sensor is included in a plunger stopper. The injection device further includes a plunger configured to transmit the trigger to the reactant. The instantiation signal includes a thermic signal and the reactant includes two reactants configured to generate an exothermic reaction in response to the trigger. The sensor includes a temperature sensor. The temperature sensor includes a first temperature sensor configured to detect the thermic signal generated by the two reactants. The temperature sensor includes a second temperature sensor configured to detect a temperature of a medicament stored in a medicament reservoir. The activation signal is based on a temperature difference between the medicament and the exothermic reaction. The instantiation signal includes a photo-signal and the reactant includes one or more reactants configured to generate a luminescent reaction in response to the trigger. The sensor includes a photoelectric sensor. The photoelectric sensor includes a first photoelectric sensor configured to detect a photoemission generated by the luminescent reaction. The reactant includes a first reactant and a second reactant, at least one of the first reactant and the second reactant includes a fluid reactant, the first reactant and the second reactant being separated from each other by a fluid impermeable membrane that is configured to be pierced in reaction to the trigger to enable interaction between the first reactant and the second reactant. The reactant includes a first solid reactant and a second solid reactant that is distanced from the first solid reactant in a pre-priming configuration and is configured to be mechanically coupled to the first solid reactant in reaction to the trigger to enable interaction between the first solid reactant and the second solid reactant.

In accordance with another aspect of the present invention, a medicament injection system includes: an injection device and an external device that includes an external processor configured to communicate with the injection device.

It is appreciated that systems in accordance with the present disclosure can include any combination of the aspects and features described herein. That is to say that methods in accordance with the present disclosure are not limited to the combinations of aspects and features specifically described herein, but also include any combination of the aspects and features provided.

The details of one or more embodiments of the present disclosure are set forth in the accompanying drawings and the description below. Other features and advantages of the present disclosure will be apparent from the description and drawings, and from the claims.

BRIEF DESCRIPTION OF THE FIGURES

Like reference symbols in the various drawings indicate like elements.

DETAILED DESCRIPTION

Implementations of the present disclosure are generally directed to controlled activation of an energy source of an injection device to prevent idle drainage of the energy source. More particularly, implementations of the present disclosure are directed to a mechanism configured to receive a trigger signal and in response to receiving the trigger signal, generating an instantiation signal to activate the energy source of the injection device to the electronic component.

In some injection devices, the energy source of the injection device can be activated in response to false trigger signals, prior to intended usage of the injection device, leading to idle drainage of the energy source. Accordingly, use of electronic injection devices can be hindered by idle drainage of the energy source. In some injection devices, the activation process of the energy source of the injection device can take extended periods of time after the injection device is primed. Prolonged activation processes or additional user interactions that may be required and that are not part of the standard injection workflow can render the injection devices as being unpractical. As described in further detail herein, implementations of the present disclosure address these challenges. For example, in accordance with implementations, the electronic injection device can be quickly (e.g., within seconds) activated in response to signals generated by reactants that are separated from each other until a trigger signal is initiated (e.g., during a priming step of a medicament administration) to prevent idle drainage of the energy source.

Figure 1A:
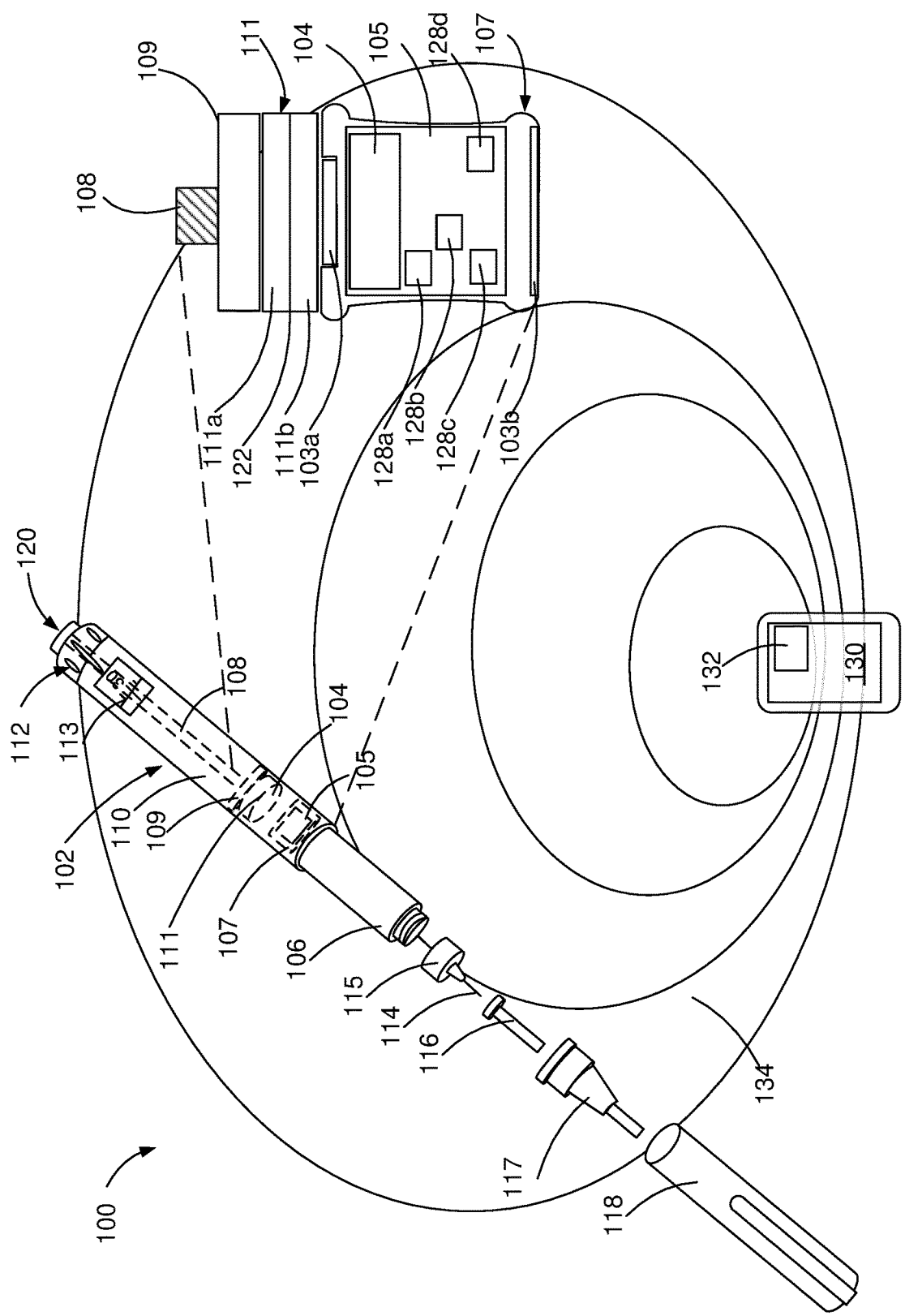
FIGS. 1A and 1B are exploded views of examples of devices in accordance with the present disclosure.
Figure 1B:
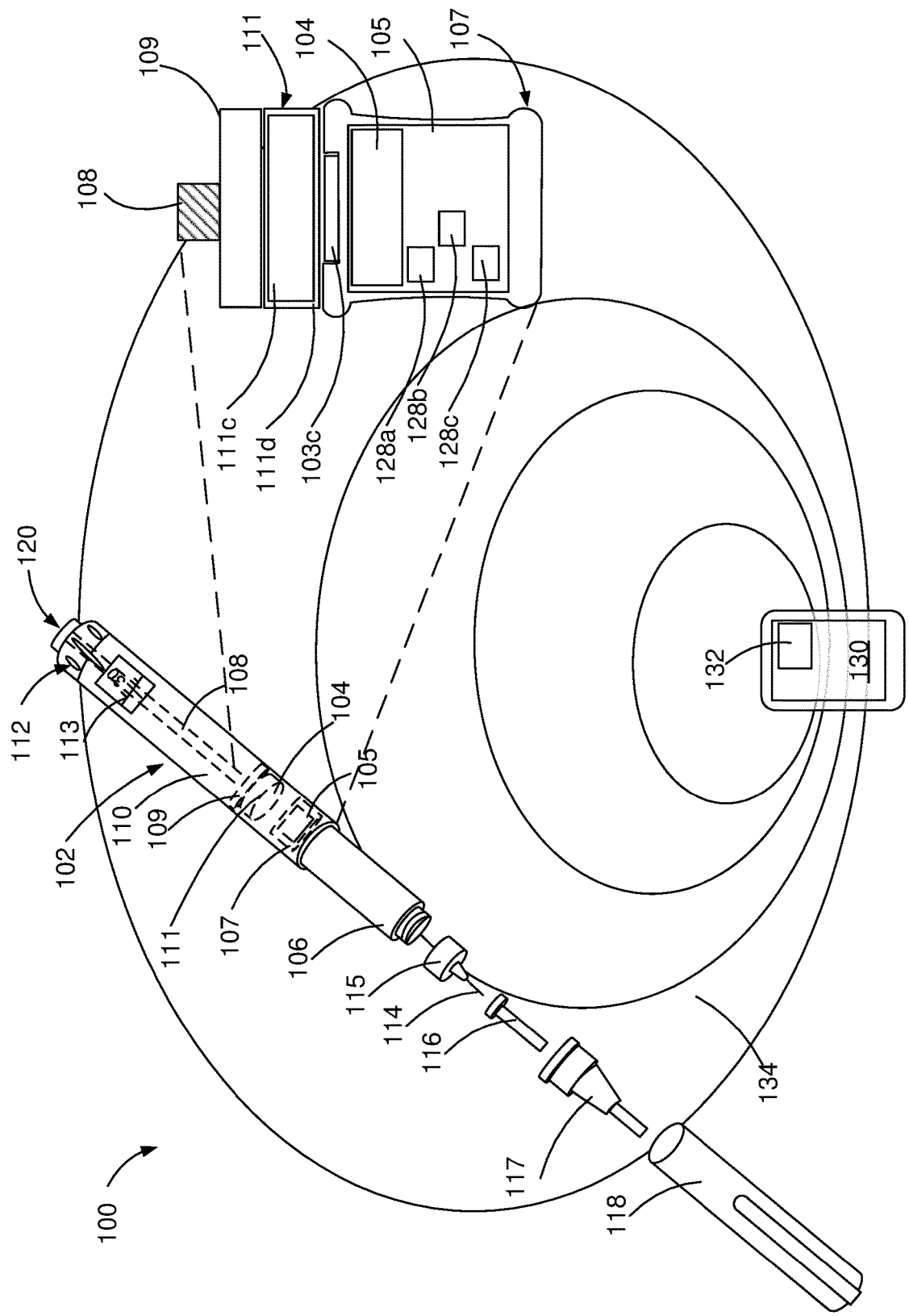

FIGS. 1A and 1B illustrate exploded views of example fluid delivery systems 100. The example fluid delivery systems 100 can be configured to assist a user in injecting a fluid (e.g., a medicament) and facilitate sharing of medical data. The example fluid delivery systems 100 can include an injection device 102 and an external device 130. The injection device 102 can be an electronically enabled injection device configured to prevent idle drainage of an energy source 104. The injection device 102 can be a pre-filled, disposable injection pen or the injection device 102 can be a reusable injection pen with replaceable medicament reservoirs 106. The injection device 102 can be configured to communicate with the external device 130. The injection device 102 can transmit to the external device 130 operational data (e.g., data and time of start of usage of injection device 102, temperature of injection device 102 during use and storage) and corresponding treatment data (e.g., amount and time of medicament dispense by the injection device 102). In some implementations, the injection device 102 can be associated with an identifier that is used by the external device 130 to uniquely identify the injection device 102.

The injection device 102 can include a housing 110 and a needle assembly 115. The housing 110 can contain the energy source 104, an electronic system 105, a medicament reservoir 106, a stopper 107, a plunger rod 108, a plunger head 109, a bearing 111, a priming component (e.g., dosage knob) 112, a dosage window 113, and an injection button 120. The housing 110 can be molded from a medical grade plastic material such as a liquid crystal polymer.

The medicament reservoir 106 can be configured to contain a fluid medicament. The medicament reservoir 106 can be a conventional, generally cylindrical, disposable container like a cartridge or a syringe used to package prepared fluids such as medicaments, anesthetics and the like. The medicament reservoir 106 can be provided with a pair of ends, one end having a pierceable membrane, which receives an inward end of needle 114 in sealing engagement. A dose of the contained medicament can be ejected from the injection device 102 by turning the dosage knob 112, and the selected dose is then displayed via dosage window 113, for instance in multiples of so-called International Units (IU), wherein one IU is the biological equivalent of about 45.5 micrograms of pure crystalline medicament (e.g., 1/22 mg). An example of a selected dose displayed in dosage window 113 may for instance be 30 IUs, as shown in FIG. 1A. In some implementations, the selected dose can be displayed differently, for instance by an electronic display (e.g., the dosage window 113 may take the form of an electronic display). Turning the dosage knob 112 can cause a mechanical click sound to provide acoustical feedback to a user. The numbers displayed in dosage window 113 can be printed on a sleeve that is contained in housing 110 and mechanically interacts with a plunger head 109 that is fixed at the end of the plunger rod 108 and pushes the stopper 107 of the medicament reservoir 106.

The plunger head 109 (e.g., a back end of the plunger rod 108) can be configured to expel a portion of the fluid by displacing the stopper 107 contained within the medicament reservoir 106, such that a position of the stopper 107 is associated with an amount of the fluid within the injection device 102.

The bearing 111 can provide firm mounting to one or both ends of the plunger rod 108. The bearing 111 can be positioned between the plunger head 109 and the stopper 107. The bearing 111 can be configured to include components configured to activate the energy source 104. For example, one or more reactants 111a, 111b, 111c can be included in or attached to the bearing 111. The reactants 111a, 111b, 111c can be solid and/or fluid reactants (111a, 111b). The reactants 111a, 111b, 111c can be configured to generate an exothermic or a luminescent reaction (e.g., chemiluminescence, crystalloluminescence, fluorescence, or phosphorescence) in response to the trigger. For example, the reactants 111a, 111b, 111c can include alkali metals and other highly electropositive metals that exothermally react when coming in contact with water, strong acids that exothermally react when coming in contact with water or strong bases that exothermally react when coming in contact with water. As another example, the reactants 111a, 111b, 111c can include fluorescent materials or phosphorescent materials that absorb light (e.g., after the injection device 102 is removed from a storage packaging) and then they emit light for a particular amount time. In some implementations, multiple reactants 111a, 111b are stored in separate compartments that are separated from each other by a fluid (e.g., gas and/or liquid) impermeable membrane 122. The fluid impermeable membrane can be configured to be pierced, torn or removed in reaction to a trigger (e.g., priming displacement of the plunger 108) to initiate interaction between the first reactant 111a and the second reactant 111b. In some implementations, the geometrical characteristics (e.g., interface size, volume) of the reactants 111a, 111b, 111c and the concentration of the reactants 111a, 111b, 111c can be configured to generate an instantiating signal above a first threshold and below a second threshold. The first threshold can include a detection threshold. The second threshold can be selected based on a safety for handling the injection device. For example, an increase in temperature due to the exothermic reaction can be below a temperature that might affect the stored medicament or might harm a user of the injection device 102. To prevent altering the stored medicament and for safety of the injection device handling, the maximum temperature elevation can be limited to a value in a range from about 5° C. to about 30° C.

In some implementations, a reactant 111a can include a metal container and a reactant 111b can include an electrode configured to be used for generating an exothermic reaction. The metal container can be plated with a hydrogen absorbing material. The metal container can have one or more open ends. The electrode can be received through a first open end into the metal container. The metal container can be filled with a pressurized gas (e.g., hydrogen). To trigger an exothermic reaction, a magnetic field can be applied. In some embodiments, a strength of the applied magnetic field can be depend on a dimension of the metal container. For example, the strength of the applied magnetic field can be dependent on the distance between the metal container and the electrode. In one embodiment, the hydrogen absorbing material plated on the interior wall of the metal reactant can include nickel, palladium or other metals or metal alloys capable of forming a hydride or deuteride.

In some implementations, the composition of the bearing 111 can be configured to transmit an instantiation signal generated by the interaction of the reactants 111a, 111b, 111c. For example, at least a portion of the bearing 111 that is proximal to the interface with the stopper 107 can be configured to be a good thermal conductor (e.g., if the reactants 111a, 111b, 111c are configured to generate an exothermic reaction) or to be optically transparent (e.g., if the reactants 111a, 111b, 111c are configured to generate a luminescent reaction).

The stopper 107 can be a flexible stopper, such as a rubber stopper or a rigid stopper with a sealing component. The stopper 107 can have an outwardly projecting rim matching the geometry and dimensions of the energy source 104. The stopper 107 can be of a sufficient length so that the stopper 107 is not ripped or twisted when being engaged by the plunger head 109. The stopper 107 can be of a sufficient volume to house the detection system 103, the energy source 104, and the electronic system 105. The detection system 103 can include one or more sensors 103a, 103b, 103c. The sensor type can be configured to match the reactant type. For example, if the reactants 111a, 111b, 111c are configured to generate an exothermic reaction, the sensors 103a, 103b, 103c are configured to include temperature sensors. If the reactants 111a, 111b, 111c are configured to generate a luminescent reaction, the sensors 103a, 103b, 103c are configured to include photo sensors (e.g., a photodiode or a light dependent resistor). If the reactants 111a, 111b, 111c are configured to generate both an exothermic reaction and a luminescent reaction, a portion of the sensors 103a, 103b, 103c can be configured to include temperature sensors and another portion of the sensors 103a, 103b, 103c can be configured to include photo sensors (e.g., a photodiode or a light dependent resistor).

In some implementations, the detection system 103 includes a single sensor 103a (as illustrated in FIG. 1A) or 103c (as illustrated in FIG. 1B) positioned at the end of the stopper 107 that is proximal to the bearing 111. In some implementations, the detection system 103 includes two sensors 103a, 103b (as illustrated in FIG. 1A) one sensor 103A positioned at the end of the stopper 107 that is proximal to the bearing 111 and a second sensor 103B positioned at the end of the stopper 107 that is proximal to the medicament reservoir 106. The sensor 103A positioned at the end of the stopper 107 that is proximal to the bearing 111 can be configured to detect a signal generated by the reactants 111a, 111b, 111c. The sensor 103B positioned at the end of the stopper 107 that is proximal to the medicament reservoir 106 can be configured to detect a parameter (e.g., temperature or luminance) associated with the medicament reservoir 106. In some implementations, the detection system 103 is configured to compare the values of the signals detected by the two sensors 103A, 103b to determine a difference between the measurements. The difference in measurements can be compared to a threshold difference to filter out false positive trigger signals. The detection system 103 can be configured to generate an activation signal based on the measurements or the difference in measurements of the sensors 103a, 103b, 103c and transmit it to the energy source 104 to activate the electronic system 105.

The energy source 104 can be a disposable or rechargeable battery, such as a 1.5V-5 V silver-oxide or lithium battery (e.g., SR626, SR516, SR416) or a super capacitor. In some implementations, energy source 104 can include a plurality of batteries (e.g., two 1.5V batteries). The energy source 104 can be configured to supply energy to the electronic system 105 under particular conditions, such as after receiving the activation signal from the detection system 103.

The electronic system 105 can include one or more electronic components configured to perform and/or assist with one or more functions of the injection device 102 (e.g., the ejection of the medicament) upon coupling with the energy source 104. For example, the electronic system 105 can include one or more processors 128a, a sensor 128b (e.g., a sensor configured to detect a function of the injection device 102 or a volume of stored medicament in the medicament reservoir 106), an antenna 128c, and a motor 128d. The motor 128d can be configured to advance in micro-step increments to dispense a particular amount of medicament. The sensor 128b can provide, to the one or more processors 128a, a signal (e.g., a voltage), which is proportional to the amount of medicament dispensed or amount of medicament remaining in the medicament reservoir 106. The one or more processors 128a can include a microprocessor. In some implementations, the microprocessor is a microcontroller, e.g., a combination of microprocessor components and other components formed in a single package. The microprocessor can be an arithmetic and/or a logic unit array. The one or more processors 128a can process one or more signals received from the other electronic components of the electronic system 105 and transmit a signal to the antenna 128c. For example, the one or more processors 128a can be configured to execute operations on received data to generate output data, as described in detail with reference to FIG. 2. The one or more processors 128a can be configured to determine the amount of the fluid within the injection device 102 based at least in part on an electrical signal and transmit the data including the amount of the fluid to the antenna 128c that can transmit it to the external device 130.

The antenna 128c can be a bluetooth or near-field communication (NFC) antenna. The antenna 128c can be configured to transmit signals to the one or more processors 128a and to the external device 130. The signals transmitted by the antenna 128c can include the amount of the fluid in the medicament reservoir 106, values measured by the sensor 128b, and the identifier of the injection device 102. The communication field 134 can be a bluetooth field or an NFC field, generated by the external device 130. The external device 130 can include a bluetooth or a RF module, a transmitter, a receiver, and an external processor 132. The external processor 132 can be configured to process the data transmitted by the injection device 102. The external device 130 can be configured to display (e.g., through a graphical user interface) the data received from the injection device 102 and processed by the external processor 132.

The needle assembly 115 includes a needle 114 that can be affixed to the housing 110. The needle 114 can be covered by an inner needle cap 116 and an outer needle cap 117, which in turn can be covered by a cap 118. When needle 114 is stuck into a skin portion of a patient, and then injection button 120 is pushed, the medicament dose displayed in dosage window 113 can be ejected from injection device 102. When the needle 114 of injection device 102 remains for a certain time in the skin portion after the injection button 120 is pushed, a high percentage (e.g., more than 90%) of the dose is actually injected into the patient's body. Ejection of the medicament dose can generate a mechanical click sound, which can be different from the sounds produced when using dosage knob 112.

The injection device 102 can be used for several injection processes until either medicament reservoir 106 is empty or the expiration date of injection device 102 (e.g., 28 days after the first use) is reached. Before using injection device 102 for the first time, it may be necessary to perform a priming operation to close a possible gap between the plunger head and the stopper, to couple the energy source 104 to the electric component and/or to remove air from medicament reservoir 106 and needle 114. For instance, the priming operation can include selecting two units of medicament and pressing injection button 120 while holding injection device 102 with the needle 114 upwards. The impulse generated by selecting two units of medicament or pressing injection button 120 can trigger the electrical coupling of the energy source 104 with the electronic system 105. For example, as illustrated in FIGS. 1A and 1B, the impulse generated by selecting two units of medicament or pressing injection button 120 can be transmitted by the plunger rod 108, leading to a shift of one of the reactants 111*a* from a first position to a second position (to generate a reaction), which activates the energy source 104 to power the electronic system 105.

In some implementations, the electronic components of the electronic system 105 can be integrated within the housing 110 at a single location, or at multiple locations (e.g., within or attached to a plunger rod 108, and a cavity in the plunger head 109). In some implementations, as illustrated in FIGS. 1A and 1B, one or more components of the electronic system 105 can be contained within the stopper 107. In some implementations, one or more components of the electronic system 105 can be contained within the plunger head 109.

In some implementations, the location of the energy source 104 and/or the location of one or more electronic components of the electronic system 105 can be selected independent from the coupling between the electronic system 105 and the energy source 104. In some implementations, one or more characteristics of one or more electronic components of the electronic system 105 and/or one or more characteristics of the energy source 104 can be selected to couple and/or uncouple the electronic system 105 from the energy source 104.

In some implementations, the housing 110 of the injection device 102 can be configured to provide thermal insulation to reduce or prevent transmission of the heat generated by the exothermal reaction to a user handling the injection device 102. In some implementations, the housing 110 of the injection device 102 can be configured to be separated in multiple segments to enable a user to attach the energy source 104 to a component of the injection device 102 (e.g., plunger rod 108 or plunger head 109) and/or attach at least a component of the electronic system 105 to a component of the injection device 102 (e.g., stopper 107 or plunger head 109). The examples illustrated in FIGS. 1A and 1B, include an energy source 104 attached to the plunger head 109. Even though not illustrated, the energy source 104 can be attached to or placed in the plunger rod 108 and can be customized to fit into the geometry of the plunger rod 108. Within the example of the energy source 104 attached to the plunger rod 108, the connections to the electronic unit 105 are configured to cross the plunger head 109.

In some implementations, the housing 110 of the injection device 102 can be configured to be separated or broken in multiple segments to provide a user access to the energy source 104, to enable separate disposal of the energy source 104. In some implementations, the medicament reservoir 106 to be assembled with the injection device 102 is manufactured with inserted stopper 107, is filled with the fluid medicament and is closed with a crimp seal.

During the manufacturing and storage of the medicament reservoir 106 prior to assembly with the injection device 102, the energy source 104 is not activated. By keeping the energy source 104 deactivated, no idle drainage of energy can occur during manufacturing and potential long storage of the medicament reservoir 106. In the subsequent step of device assembly or device priming, the energy source 104 of the injection device 102 is activated to power the electronic system 105. In some implementations, the energy source 104 can be connected at this step of device assembly to the electronic system 105 to enable controls of functionality of the injection device 102. Connection to the energy source 104 as manufacturing step allows to wake-up the electronic system 105 and to generate feedback signals that confirm proper system functionality. After performing such in-process controls, the energy source 104 may be disconnected again, or the electronic system 105 may be set in sleep-mode through appropriate software features that reduce energy consumption until the priming step is performed to wake-up the electronic system 105.

Figure 2:
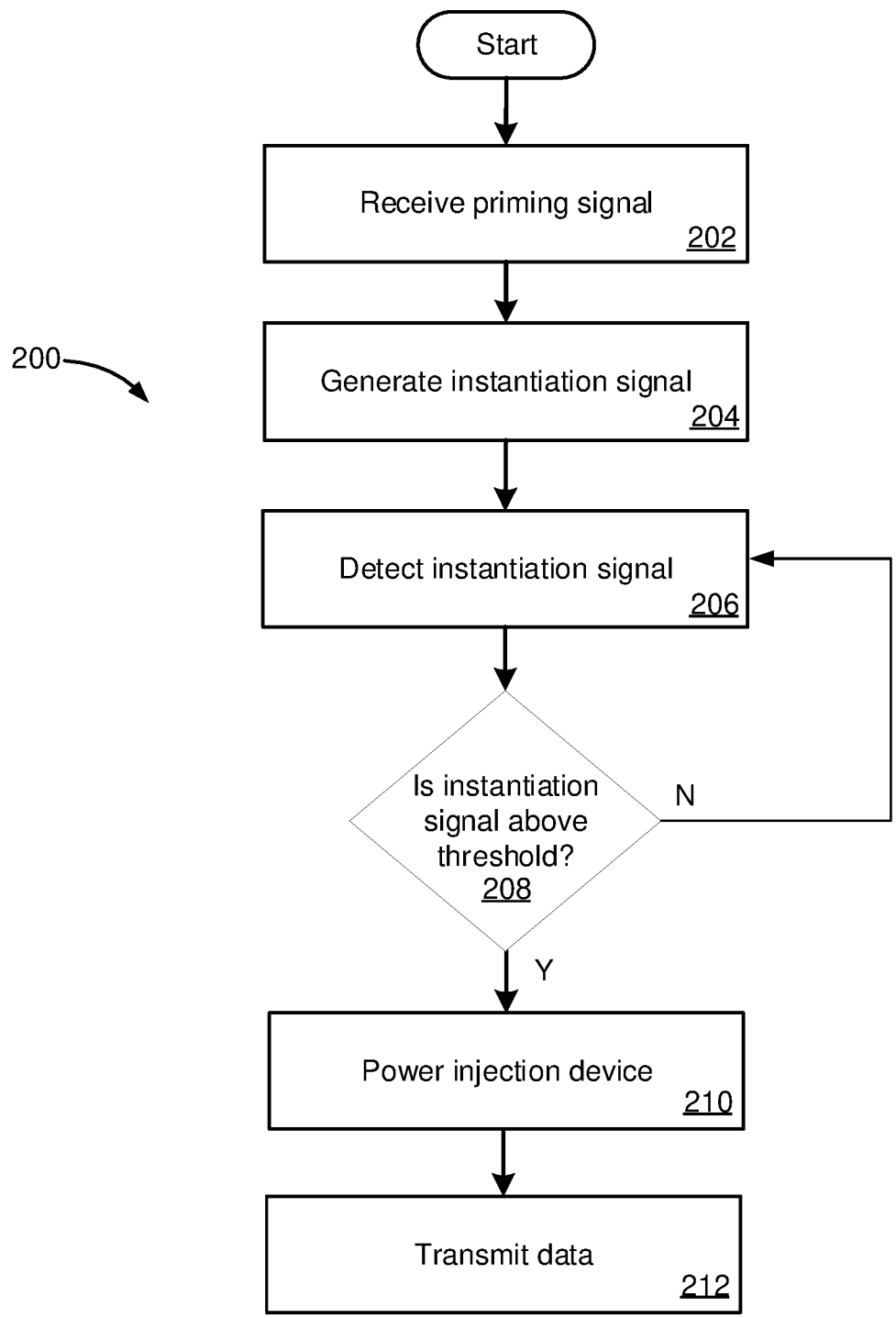
FIG. 2 is a flowchart illustrating an example process that can be executed to perform operations of the present disclosure.

FIG. 2 is a flowchart illustrating an example process 200 that can be executed by devices and systems described with reference to FIGS. 1A and 1B. The process 200 begins by performing a priming operation on an injection device having an energy source uncoupled from an electronic component (202). The priming operation can be initiated by a user of the injection device. An example of a priming operation performed with the injection device can include selecting a particular number (e.g., one or two) of units of medicament and pressing an injection button while holding the injection device with the needle upwards. Another example of a priming operation performed with the injection device can include pressing a priming button of the injection device configured as an electric switch. Another example of a priming operation performed with the injection device can include attaching the energy source to a component of the injection device (e.g., plunger head) and/or attaching at least a component of the electronic system to a component of the injection device (e.g., plunger head or stopper) before pressing a priming button of the injection device. In some implementations, the priming operation can include generating a trigger signal. The trigger signal can include at least one of a mechanical signal and an electrical signal.

In response to the priming operation (e.g., receiving the trigger signal), an instantiation signal is generated by a reactant or by the interaction of multiple reactants in response to the trigger signal. The instantiation signal can include a thermic signal and/or a photo-signal. In some implementations, at least one reactant includes a fluid reactant and is separated from another reactant by a fluid impermeable membrane. The fluid impermeable membrane is configured to be pierced in reaction to the trigger signal to enable interaction between the reactants and to generate the instantiation signal. In some implementations, both reactants include solid reactants and are distanced from each other in an initial configuration. At least one of the reactants can be configured to be displaced in reaction to the trigger signal to enable coupling and interaction with the other reactant to generate the instantiation signal.

The instantiation signal is detected by a detection system including a single sensor or a pair of sensors (206). In some implementations, the detection of the instantiation signal can include determining a difference between the measurements of two sensors (one located proximal to the reactants and another one located distal from the reactants and proximal to the medicament reservoir).

The instantiation signal or the difference in measurements is compared to an activation threshold to filter out false positive trigger signals (208). In some implementations, the instantiation signal or the difference in measurements is compared to a safety threshold, which if exceeded generates an alert indicating a malfunction of the injection device. For example, if a temperature increase exceeded a safety threshold, the alert can direct the user to avoid contact with the injection device and discard the injection device after a predetermined period of time. If the comparison indicates that the measurement is below the activation threshold, process 200 returns to measurement of the instantiation signal.

If the comparison indicates that the measurement is above the activation threshold, an activation signal is generated, by the detection system, to activate the electronic system (210). For example, the energy source can be coupled with the electronic component by a mechanism (e.g., gear mechanism). In some implementations, the mechanism can include one or more components (e.g., a plunger rod 108, a plunger head 109, as described with reference to FIGS. 1A and 1B) configured to shift the energy source from one position, in which the energy source is electrically decoupled from the electronic component to a second position, in which the energy source is electrically coupled with the electronic component. In some implementations, the mechanism can include a switch configured to be activated for electrically coupling the energy source to the electronic component.

In response to coupling the energy source with the electronic component, an electric signal is generated (212). The electric signal can be generated to assist and/or perform an operation of the injection device (e.g., control an administration of a medicament) and/or measure one or more parameters associated to the injection device (e.g., amount of a medicament, temperature, etc.). The electric signal can include generation of injection device data. The injection device data can include a unique identifier for the injection device, an amount of administered medicament, an amount of medicament within a cartridge and/or injection device, a medicament temperature, a timestamp of coupling the energy source to the electronic component, a location, and/or a situation specific data for the injection device.

Figure 3:
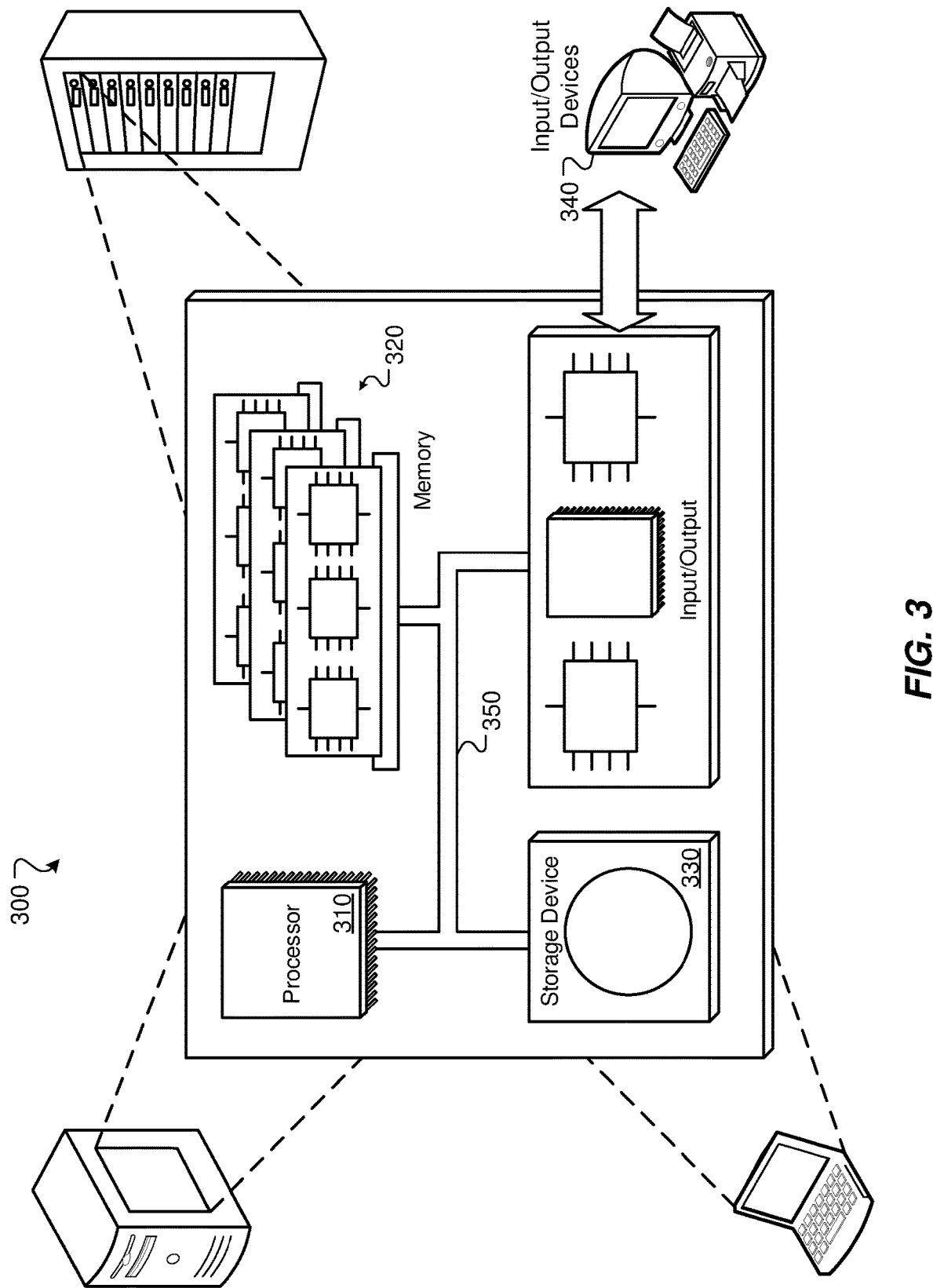
FIG. 3 is a schematic illustration of example computer systems that can be used to execute implementations of the present disclosure.

FIG. 3 shows a schematic diagram of an example computing system 300. The system 300 can be used for the operations described in association with the implementations described herein. For example, the system 300 may be included in any or all of the server components discussed herein. The system 300 includes a processor 310, a memory 320, a storage device 330, and an input/output device 340. Each of the components 310, 320, 330, and 340 are interconnected using a system bus 350. The processor 310 is capable of processing instructions for execution within the system 300. In one implementation, the processor 310 is a single-threaded processor. In another implementation, the processor 310 is a multi-threaded processor. The processor 310 is capable of processing instructions stored in the memory 320 or on the storage device 330 to display graphical information for a user interface on the input/output device 340.

The memory 320 stores information within the system 300. In one implementation, the memory 320 is a computer-readable medium. In one implementation, the memory 320 is a volatile memory unit. In another implementation, the memory 320 is a non-volatile memory unit. The storage device 330 is capable of providing mass storage for the system 300. In one implementation, the storage device 330 is a computer-readable medium. In various different implementations, the storage device 330 may be a floppy disk device, a hard disk device, an optical disk device, or a tape device. The input/output device 340 provides input/output operations for the system 300. In one implementation, the input/output device 340 includes a keyboard and/or pointing device. In another implementation, the input/output device 340 includes a display unit for displaying graphical user interfaces that enable a user to access data related to an item that is collected, stored and queried as described with reference to FIGS. 1-3.

The features described can be implemented in digital electronic circuitry, or in computer hardware, firmware, software, or in combinations of them. The apparatus can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network, such as the described one. The relationship of client and server arises by virtue of computer programs running on the respective computers and having a client-server relationship to each other.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

The terms "drug" or "medicament" are used herein to describe one or more pharmaceutically active compounds. As described below, a drug or medicament can include at least one small or large molecule, or combinations thereof, in various types of formulations, for the treatment of one or more diseases. Exemplary pharmaceutically active compounds may include small molecules; polypeptides, peptides and proteins (e.g., hormones, growth factors, antibodies, antibody fragments, and enzymes); carbohydrates and polysaccharides; and nucleic acids, double or single stranded DNA (including naked and cDNA), RNA, antisense nucleic acids such as antisense DNA and RNA, small interfering RNA (siRNA), ribozymes, genes, and oligonucleotides. Nucleic acids may be incorporated into molecular delivery systems such as vectors, plasmids, or liposomes. Mixtures of one or more of these drugs are also contemplated.

The term "drug delivery device" shall encompass any type of device or system configured to dispense a volume of a drug into a human or animal body. The volume can typically range from about 0.5 ml to about 10 ml. Without limitation, the drug delivery device may include a syringe, needle safety system, pen injector, auto injector, large-volume device (LVD), pump, perfusion system, or other device configured for subcutaneous, intramuscular, or intravascular delivery of the drug. Such devices often include a needle, wherein the needle can include a small gauge needle (e.g., greater than about 24 gauge, and including 27, 29, or 31 gauge).

In combination with a specific drug, the presently described devices may also be customized in order to operate within required parameters. For example, within a certain time period (e.g., about 3 to about 20 seconds for injectors, and about 5 minutes to about 60 minutes for an LVD), with a low or minimal level of discomfort, or within certain conditions related to human factors, shelf-life, expiry, biocompatibility, environmental considerations, etc. Such variations can arise due to various factors, such as, for example, a drug ranging in viscosity from about 3 cP to about 50 cP.

The drug or medicament may be contained in a primary package or "drug container" adapted for use with a drug delivery device. The drug container may be, e.g., a cartridge, syringe, reservoir, or other vessel configured to provide a suitable chamber for storage (e.g., short- or long-term storage) of one or more pharmaceutically active compounds. For example, in some instances, the chamber may be designed to store a drug for at least one day (e.g., 1 to at least 30 days). In some instances, the chamber may be designed to store a drug for about 1 month to about 2 years. Storage may occur at room temperature (e.g., about 20° C.), or refrigerated temperatures (e.g., from about −3° C. to about 3° C.). In some instances, the drug container may be or may include a dual-chamber cartridge configured to store two or more components of a drug formulation (e.g., a drug and a diluent, or two different types of drugs) separately, one in each chamber. In such instances, the two chambers of the dual-chamber cartridge may be configured to allow mixing between the two or more components of the drug or medicament prior to and/or during dispensing into the human or animal body. For example, the two chambers may be configured such that they are in fluid communication with each other (e.g., by way of a conduit between the two chambers) and allow mixing of the two components when desired by a user prior to dispensing. Alternatively, or in addition, the two chambers may be configured to allow mixing as the components are being dispensed into the human or animal body.

The drug delivery devices and drugs described herein can be used for the treatment and/or prophylaxis of many different types of disorders. Exemplary disorders include, e.g., diabetes mellitus or complications associated with diabetes mellitus such as diabetic retinopathy, thromboembolism disorders such as deep vein or pulmonary thromboembolism. Further exemplary disorders are acute coronary syndrome (ACS), angina, myocardial infarction, cancer, macular degeneration, inflammation, hay fever, atherosclerosis and/or rheumatoid arthritis.

Exemplary drugs for the treatment and/or prophylaxis of diabetes mellitus or complications associated with diabetes mellitus include an insulin, e.g., human insulin, or a human insulin analogue or derivative, a glucagon-like peptide (GLP-1), GLP-1 analogues or GLP-1 receptor agonists, or an analogue or derivative thereof, a dipeptidyl peptidase-4 (DPP4) inhibitor, or a pharmaceutically acceptable salt or solvate thereof, or any mixture thereof. As used herein, the term "derivative" refers to any substance which is sufficiently structurally similar to the original substance so as to have substantially similar functionality or activity (e.g., therapeutic effectiveness).

Exemplary insulin analogues are Gly(A21), Arg(B31), Arg(B32) human insulin (insulin glargine); Lys(B3), Glu (B29) human insulin; Lys(B28), Pro(B29) human insulin; Asp(B28) human insulin; human insulin, wherein proline in position B28 is replaced by Asp, Lys, Leu, Val or Ala and wherein in position B29 Lys may be replaced by Pro; Ala(B26) human insulin; Des(B28-B30) human insulin; Des(B27) human insulin and Des(B30) human insulin.

Exemplary insulin derivatives are, for example, B29-N-myristoyl-des(B30) human insulin; B29-N-palmitoyl-des (B30) human insulin; B29-N-myristoyl human insulin; B29-N-palmitoyl human insulin; B28-N-myristoyl LysB28ProB29 human insulin; B28-N-palmitoyl-LysB28ProB29 human insulin; B30-N-myristoyl-ThrB29LysB30 human insulin; B30-N-palmitoyl-ThrB29LysB30 human insulin; B29-N—(N-palmitoyl-gamma-glutamyl)-des(B30) human insulin; B29-N—(N-lithocholyl-gamma-glutamyl)-des(B30) human insulin; B29-N-(ω-carboxyheptadecanoyl)-des(B30) human insulin and B29-N-(ω-carboxyhepta ¬decanoyl) human insulin. Exemplary GLP-1, GLP-1 analogues and GLP-1 receptor agonists are, for example: Lixisenatide/AVE0010/ZP10/ Lyxumia, Exenatide/Exendin-4/Byetta/Bydureon/ITCA 650/AC-2993 (a 39 amino acid peptide which is produced by the salivary glands of the Gila monster), Liraglutide/ Victoza, Semaglutide, Taspoglutide, Syncria/Albiglutide, Dulaglutide, rExendin-4, CJC-1134-PC, PB-1023, TTP-054, Langlenatide/HM-11260C, CM-3, GLP-1 Eligen, ORMD-0901, NN-9924, NN-9926, NN-9927, Nodexen, Viador-GLP-1, CVX-096, ZYOG-1, ZYD-1, GSK-2374697, DA-3091, MAR-701, MAR709, ZP-2929, ZP-3022, TT-401, BHM-034. MOD-6030, CAM-2036, DA-15864, ARI-2651, ARI-2255, Exenatide-XTEN and Glucagon-Xten.

An exemplary oligonucleotide is, for example: mipomersen/Kynamro, a cholesterol-reducing antisense therapeutic for the treatment of familial hypercholesterolemia.

Exemplary DPP4 inhibitors are Vildagliptin, Sitagliptin, Denagliptin, Saxagliptin, Berberine.

Exemplary hormones include hypophysis hormones or hypothalamus hormones or regulatory active peptides and their antagonists, such as Gonadotropine (Follitropin, Lutropin, Choriongonadotropin, Menotropin), Somatropine (Somatropin), Desmopressin, Terlipressin, Gonadorelin, Triptorelin, Leuprorelin, Buserelin, Nafarelin, and Goserelin. Exemplary polysaccharides include a glucosaminoglycane, a hyaluronic acid, a heparin, a low molecular weight heparin or an ultra-low molecular weight heparin or a derivative thereof, or a sulphated polysaccharide, e.g. a poly-sulphated form of the above-mentioned polysaccharides, and/or a pharmaceutically acceptable salt thereof. An example of a pharmaceutically acceptable salt of a poly-sulphated low molecular weight heparin is enoxaparin sodium. An example of a hyaluronic acid derivative is Hylan G-F 20/Synvisc, a sodium hyaluronate.

The term "antibody", as used herein, refers to an immunoglobulin molecule or an antigen-binding portion thereof. Examples of antigen-binding portions of immunoglobulin molecules include F(ab) and F(ab')2 fragments, which retain the ability to bind antigen. The antibody can be polyclonal, monoclonal, recombinant, chimeric, de-immunized or humanized, fully human, non-human, (e.g., murine), or single chain antibody. In some embodiments, the antibody has effector function and can fix complement. In some embodiments, the antibody has reduced or no ability to bind an Fc receptor. For example, the antibody can be an isotype or subtype, an antibody fragment or mutant, which does not support binding to an Fc receptor, e.g., it has a mutagenized or deleted Fc receptor binding region.

The terms "fragment" or "antibody fragment" refer to a polypeptide derived from an antibody polypeptide molecule (e.g., an antibody heavy and/or light chain polypeptide) that does not comprise a full-length antibody polypeptide, but that still comprises at least a portion of a full-length antibody polypeptide that is capable of binding to an antigen. Antibody fragments can comprise a cleaved portion of a full-length antibody polypeptide, although the term is not limited to such cleaved fragments. Antibody fragments that are useful in the present disclosure include, for example, Fab fragments, F(ab')2 fragments, scFv (single-chain Fv) fragments, linear antibodies, monospecific or multispecific antibody fragments such as bispecific, trispecific, and multispecific antibodies (e.g., diabodies, triabodies, tetrabodies), minibodies, chelating recombinant antibodies, tribodies or bibodies, intrabodies, nanobodies, small modular immunopharmaceuticals (SMIP), binding-domain immunoglobulin fusion proteins, camelized antibodies, and VHH containing antibodies. Additional examples of antigen-binding antibody fragments are known in the art.

The terms "Complementarity-determining region" or "CDR" refer to short polypeptide sequences within the variable region of both heavy and light chain polypeptides that are primarily responsible for mediating specific antigen recognition. The term "framework region" refers to amino acid sequences within the variable region of both heavy and light chain polypeptides that are not CDR sequences, and are primarily responsible for maintaining correct positioning of the CDR sequences to permit antigen binding. Although the framework regions themselves typically do not directly participate in antigen binding, as is known in the art, certain residues within the framework regions of certain antibodies can directly participate in antigen binding or can affect the ability of one or more amino acids in CDRs to interact with antigen.

Exemplary antibodies are anti PCSK-9 mAb (e.g., Alirocumab), anti IL-6 mAb (e.g., Sarilumab), and anti IL-4 mAb (e.g., Dupilumab).

The compounds described herein may be used in pharmaceutical formulations comprising (a) the compound(s) or pharmaceutically acceptable salts thereof, and (b) a pharmaceutically acceptable carrier. The compounds may also be used in pharmaceutical formulations that include one or more other active pharmaceutical ingredients or in pharmaceutical formulations in which the present compound or a pharmaceutically acceptable salt thereof is the only active ingredient. Accordingly, the pharmaceutical formulations of the present disclosure encompass any formulation made by admixing a compound described herein and a pharmaceutically acceptable carrier. Pharmaceutically acceptable salts of any drug described herein are also contemplated for use in drug delivery devices. Pharmaceutically acceptable salts are for example acid addition salts and basic salts. Acid addition salts are e.g. HCl or HBr salts. Basic salts are e.g. salts having a cation selected from an alkali or alkaline earth metal, e.g. Na+, or K+, or Ca2+, or an ammonium ion N+(R1)(R2)(R3)(R4), wherein R1 to R4 independently of each other mean: hydrogen, an optionally substituted C1-C6-alkyl group, an optionally substituted C2-C6-alkenyl group, an optionally substituted C6-C10-aryl group, or an optionally substituted C6-C10-heteroaryl group. Further examples of pharmaceutically acceptable salts are known to those of skill in the arts.

Pharmaceutically acceptable solvates are for example hydrates or alkanolates such as methanolates or ethanolates.

A number of implementations of the present disclosure have been described. Nevertheless, it will be understood that various modifications may be made without departing from the spirit and scope of the present disclosure. Accordingly, other implementations are within the scope of the following claims.

REFERENCE NUMERALS 100 medicament system
102 injection device
103 medicament amount detection system
103a, 103b, 103c sensors
104 energy source
105 electronic system
106 medicament reservoir
107 stopper
108 plunger rod
109 plunger head
109 stopper
110 housing
111 bearing
111a, 111b, 111c reactant
112 dosage knob
113 dosage window
114 needle
115 needle assembly
116 inner needle cap
117 outer needle cap
118 cap
120 injection button 122 fluid impermeable membrane
128a processors
128b sensor
128c antenna
128d motor
130 external device
132 external processor
134 communication field

The invention claimed is:

1. An injection device comprising:
an energy source configured to power an electronic component;
a priming component configured to convert a mechanical impulse into a trigger;
a plunger configured to transmit the trigger from the priming component to a bearing;
the bearing configured to provide firm mounting to an end of the plunger;
a reactant included in the bearing and configured to initiate a thermochemical reaction that generates an instantiation signal transmittable through the bearing in response to receiving the trigger; and
a sensor configured to detect and process the instantiation signal and generate an activation signal to activate the energy source, the activation signal comprising a wakeup signal to power the electronic component of the injection device.

2. The injection device of claim 1, wherein the reactant is configured to shift from a first position to a second position to generate the instantiation signal.

3. The injection device of claim 1, wherein the sensor is included in a plunger stopper.

4. The injection device of claim 1, wherein the plunger is configured to transmit the trigger to the reactant.

5. The injection device of claim 1, wherein the instantiation signal comprises a thermic signal and the reactant comprises two reactants configured to generate an exothermic reaction in response to the trigger.

6. The injection device of claim 5, wherein the sensor comprises a temperature sensor.

7. The injection device of claim 6, wherein the temperature sensor comprises a first temperature sensor configured to detect the thermic signal generated by the two reactants.

8. The injection device of claim 7, wherein the temperature sensor comprises a second temperature sensor configured to detect a temperature of a medicament stored in a medicament reservoir.

9. The injection device of claim 8, wherein the activation signal is based on a temperature difference between the medicament and the exothermic reaction.

10. The injection device of claim 1, wherein the instantiation signal comprises a photo-signal and the reactant comprises one or more reactants configured to generate a luminescent reaction in response to the trigger.

11. The injection device of claim 10, wherein the sensor comprises a photoelectric sensor.

12. The injection device of claim 11, wherein the photoelectric sensor comprises a first photoelectric sensor configured to detect a photoemission generated by the luminescent reaction.

13. The injection device of claim 1, wherein the reactant comprises a first reactant and a second reactant, at least one of the first reactant and the second reactant comprising a fluid reactant, the first reactant and the second reactant being separated from each other by a fluid impermeable membrane that is configured to be pierced in reaction to the trigger to enable interaction between the first reactant and the second reactant.

14. The injection device of claim 1, wherein the reactant comprises a first solid reactant and a second solid reactant that is distanced from the first solid reactant in a pre-priming configuration and is configured to be mechanically coupled to the first solid reactant in reaction to the trigger to enable interaction between the first solid reactant and the second solid reactant.

15. A medicament injection system comprising:
an injection device comprising:
an energy source configured to power an electronic component,
a priming component configured to convert a mechanical impulse into a trigger,
a plunger configured to transmit the trigger from the priming component to a bearing,
the bearing configured to provide firm mounting to an end of the plunger,
a reactant included in the bearing and configured to initiate a thermochemical reaction that generates an instantiation signal transmittable through the bearing in response to receiving the trigger, and
a sensor configured to detect and process the instantiation signal and generate an activation signal to activate the energy source, the activation signal comprising a wakeup signal to power the electronic component of the injection device; and
an external device comprising an external processor configured to communicate with the injection device.

16. The medicament injection system of claim 15, wherein the sensor is included in a plunger stopper and the sensor comprises a temperature sensor.

17. The medicament injection system of claim 15, wherein the external device is configured to receive and display operational data and treatment data from the injection device.

18. A method for powering an injection device, the method comprising:
converting, by a priming component, a mechanical impulse into a trigger;
transmitting, by a plunger, the trigger from the priming component to a bearing;
initiating, by a reactant included in the bearing, a thermochemical reaction that generates an instantiation signal;
transmitting, through the bearing, the instantiation signal;
detecting, by a sensor, the instantiation signal;
processing, by the sensor, the instantiation signal to generate an activation signal; and
transmitting, by the sensor, the activation signal to an energy source, the activation signal comprising a wakeup signal to power an electronic component of the injection device.

19. The method of claim 18, further comprising:
transmitting operational data to an external device, the operational data comprising one or more of a time of start of usage of the injection device and a temperature of the injection device during use and storage.

20. The method of claim 18, further comprising:
transmitting treatment data to an external device, the treatment data comprising one or more of an amount of medicament dispensed by the injection device and a time the medicament was dispensed by the injection device.

* * * * *